(12) United States Patent
Shiokawa

(10) Patent No.: US 11,744,163 B2
(45) Date of Patent: Aug. 29, 2023

(54) SPIN-ORBIT-TORQUE TYPE MAGNETORESISTANCE EFFECT ELEMENT AND MAGNETIC MEMORY

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/935,631

(22) Filed: Jul. 22, 2020

(65) Prior Publication Data

US 2020/0350490 A1 Nov. 5, 2020

Related U.S. Application Data

(63) Continuation-in-part of application No. PCT/JP2019/018908, filed on May 13, 2019.

(30) Foreign Application Priority Data

May 31, 2018 (JP) ................................. 2018-105394

(51) Int. Cl.
*H10N 52/80* (2023.01)
*H10B 61/00* (2023.01)
(Continued)

(52) U.S. Cl.
CPC ............ *H10N 52/80* (2023.02); *H10B 61/22* (2023.02); *H10N 50/85* (2023.02); *H10N 52/00* (2023.02); *H10N 52/01* (2023.02)

(58) Field of Classification Search
CPC ........ H01I 43/04; H01L 27/228; H01L 43/06; H01L 43/10; H01L 43/14; H10N 52/80; H10N 52/00; H10N 50/85; H10B 61/22
See application file for complete search history.

(56) References Cited

U.S. PATENT DOCUMENTS 9,025,371 B1 5/2015 Huai et al.
2014/0252439 A1 9/2014 Guo
(Continued)

FOREIGN PATENT DOCUMENTS

JP 2007-335472 A 12/2007
JP 2017-216286 A 12/2017
WO 2017/090730 A1 6/2017

OTHER PUBLICATIONS

Jul. 16, 2019 International Search Report issued in International Patent Application No. PCT/JP2019/018908.

*Primary Examiner* — Latanya N Crawford Eason
(74) *Attorney, Agent, or Firm* — Oliff PLC

(57) ABSTRACT

A spin-orbit-torque type magnetoresistance effect element includes: a first ferromagnetic layer; a second ferromagnetic layer; a non-magnetic layer which is located between the first ferromagnetic layer and the second ferromagnetic layer; and a spin-orbit-torque wiring which has the first ferromagnetic layer laminated thereon, wherein the spin-orbit-torque wiring extends in a second direction intersecting a first direction corresponding to an orthogonal direction of the first ferromagnetic layer, wherein the first ferromagnetic layer includes a first laminated structure and an interface magnetic layer in order from the spin-orbit-torque wiring, wherein the first laminated structure is a structure in which a ferromagnetic conductor layer and an inorganic compound containing layer are disposed in order from the spin-orbit-torque wiring, wherein the ferromagnetic conductor layer contains a ferromagnetic metal element, and wherein the inorganic compound containing layer contains at least one inorganic compound selected from a group consisting of carbide, nitride, and sulfide.

19 Claims, 6 Drawing Sheets

(51) Int. Cl.
*H10N 50/85* (2023.01)
*H10N 52/00* (2023.01)
*H10N 52/01* (2023.01)

(56) References Cited

U.S. PATENT DOCUMENTS

| | | |
|---|---|---|
| 2014/0312441 A1 | 10/2014 | Guo |
| 2016/0359105 A1* | 12/2016 | Sandhu ................ G11C 11/161 |
| 2018/0351085 A1 | 12/2018 | Shiokawa et al. |
| 2019/0304526 A1* | 10/2019 | Honjo ................ G11C 11/1655 |
| 2021/0233577 A1* | 7/2021 | Saito .................... H01L 27/105 |

* cited by examiner

SPIN-ORBIT-TORQUE TYPE MAGNETORESISTANCE EFFECT ELEMENT AND MAGNETIC MEMORY

CROSS-REFERENCE TO RELATED APPLICATION

This application is a continuation-in-part application of International Application No. PCT/JP2019/018908, filed May 13, 2019, which claims priorities of Japanese patent application No. 2018-105394 filed May 31, 2018, the content of which are incorporated herein by reference.

TECHNICAL FIELD

The present invention relates to a spin-orbit-torque type magnetoresistance effect element and a magnetic memory.

BACKGROUND ART

A giant magnetoresistance (GMR) element including a multilayer film of a ferromagnetic layer and a non-magnetic layer and a tunnel magnetoresistance (TMR) element using an insulating layer (tunnel barrier layer, barrier layer) for a non-magnetic layer are known as a magnetoresistance effect element. Generally, the TMR element has a higher element resistance and a higher magnetoresistance (MR) ratio than the GMR element. For this reason, the TMR element has been gaining attention as elements for magnetic sensors, high-frequency components, magnetic heads, and nonvolatile random access memories (MRAMs).

The MRAM reads and writes data using a characteristic that the element resistance of the TMR element changes when the magnetization directions of two ferromagnetic layers sandwiching the insulating layer change. As a writing method of the MRAM, a writing (magnetization reversal) method using a magnetic field generated by a current or a writing (magnetization reversal) method using a spin transfer torque (STT) generated by flowing a current in a lamination direction of a magnetoresistance effect element is known.

Although the magnetization reversal of the TMR element using the STT is efficient from the viewpoint of energy efficiency, it is necessary to supply a current in the lamination direction of the magnetoresistance effect element when writing data. The write current may degrade the characteristics of the magnetoresistance effect element.

Therefore, in recent years, a spin-orbit-torque type magnetoresistance effect element using spin-orbit torque (SOT) by a pure spin current generated by spin-orbit interaction has been gaining attention as means for rotating magnetization without allowing a current to flow in the lamination direction of the magnetoresistance effect element (for example, Non-Patent Document 1 (Japanese Unexamined Patent Application, First Publication No. 2017-216286)). The SOT is induced by the pure spin current caused by the spin-orbit interaction or the Rashba effect at the interface between different materials. A current causing the SOT in the magnetoresistance effect element flows in a direction intersecting the lamination direction of the magnetoresistance effect element. That is, since the spin-orbit-torque type magnetoresistance effect element does not need to flow the current in the lamination direction of the magnetoresistance effect element, the long life of the magnetoresistance effect element is expected.

SUMMARY OF INVENTION

Technical Problem

In order to increase the drive efficiency of the magnetoresistance effect element, it is required to reduce the reversal current density necessary to reverse the magnetization using SOT. However, it is said that the switching current density by SOT is almost the same as the switching current density by STT.

The present invention has been made in view of the above-described circumstances and an object of the present invention is to provide a spin-orbit-torque type magnetoresistance effect element and a magnetic memory that reduce reversal current density.

Solution to Problem

The present invention provides the following means in order to solve the above-described problems.

(1) A spin-orbit-torque type magnetoresistance effect element according to a first aspect includes: a first ferromagnetic layer; a second ferromagnetic layer; a non-magnetic layer which is located between the first ferromagnetic layer and the second ferromagnetic layer; and a spin-orbit-torque wiring which has the first ferromagnetic layer laminated thereon, wherein the spin-orbit-torque wiring extends in a second direction intersecting a first direction corresponding to an orthogonal direction of the first ferromagnetic layer, wherein the first ferromagnetic layer includes a first laminated structure and an interface magnetic layer in order from the spin-orbit-torque wiring, wherein the first laminated structure is a structure in which a ferromagnetic conductor layer and an inorganic compound containing layer are disposed in order from the spin-orbit-torque wiring, wherein the ferromagnetic conductor layer contains a ferromagnetic metal element, and wherein the inorganic compound containing layer contains at least one inorganic compound selected from a group consisting of carbide, nitride, and sulfide.

(2) In the spin-orbit-torque type magnetoresistance effect element according to the above-described aspect, one or more second laminated structures in which a ferromagnetic conductor layer and an inorganic compound containing layer are laminated may be inserted between the first laminated structure and the interface magnetic layer.

(3) In the spin-orbit-torque type magnetoresistance effect element according to the above-described aspect, a film thickness of the ferromagnetic conductor layer of the first laminated structure may be thicker than a film thickness of the ferromagnetic conductor layer of the second laminated structure.

(4) In the spin-orbit-torque type magnetoresistance effect element according to the above-described aspect, a film thickness of the inorganic compound containing layer may be 1.0 nm or less.

(5) In the spin-orbit-torque type magnetoresistance effect element according to the above-described aspect, the first ferromagnetic layer may include a diffusion preventing layer and the diffusion preventing layer may be located on a surface opposite to a contact side to the non-magnetic layer in the interface magnetic layer.

(6) In the spin-orbit-torque type magnetoresistance effect element according to the above-described aspect, the interface magnetic layer may contain at least one element selected from a group consisting of Co, Fe, and B.

(7) A magnetic memory according to a second aspect includes a plurality of the spin-orbit-torque type magnetoresistance effect elements according to the above-described aspect.

Advantage of the Invention

According the present invention, it is possible to provide a spin-orbit-torque type magnetoresistance effect element and a magnetic memory that reduce reversal current density.

DESCRIPTION OF EMBODIMENTS

Figure 1:
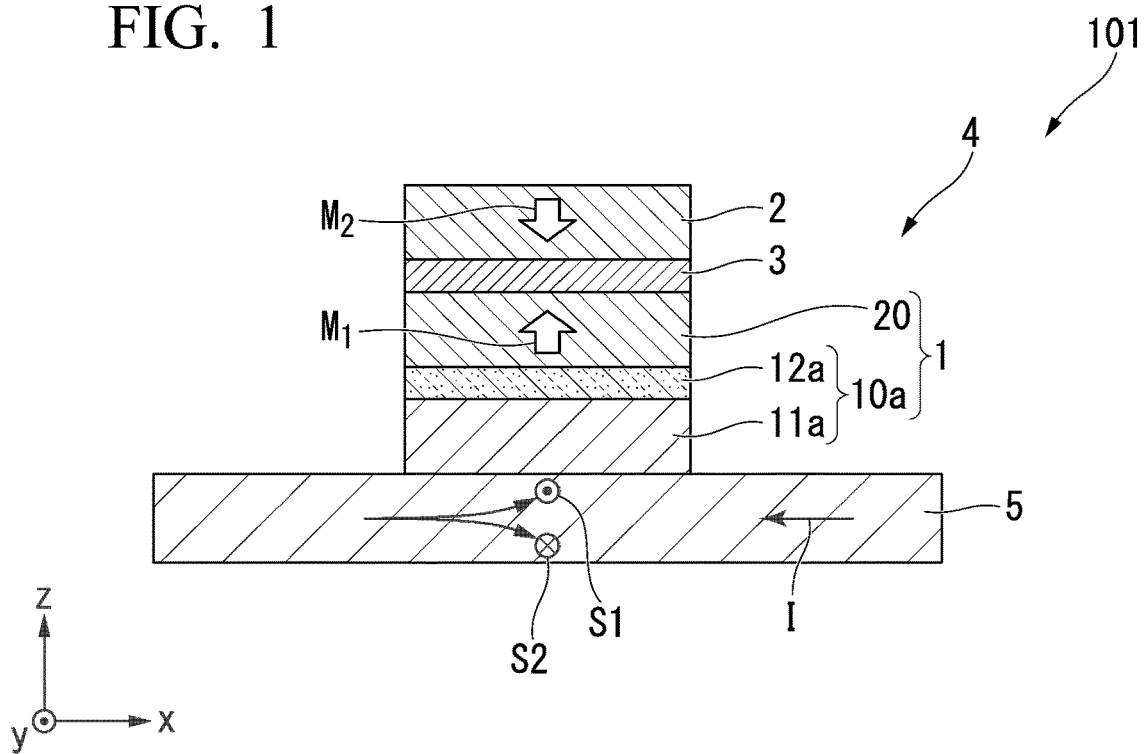
FIG. 1 is a schematic cross-sectional view of an example of a spin-orbit-torque type magnetoresistance effect element according to a first embodiment.

Hereinafter, preferred examples of the present invention will be described in detail by appropriately referring to the drawings. In the drawings used in the following description, characteristic parts are enlarged for convenience of description in order to easily understand the characteristics of the present invention and hence the dimensional ratio of each component may be different from the actual one. The materials, dimensions, and the like exemplified in the following description are merely examples and the present invention is not limited thereto and can be implemented with appropriate modifications within a range in which the effects of the present invention are exhibited.

First Embodiment (Spin-Orbit-Torque Type Magnetoresistance Effect Element)

FIG. 1 is a schematic cross-sectional view of an example of a spin-orbit-torque type magnetoresistance effect element according to a first embodiment. FIG. 1 shows a cross-section in which the spin-orbit-torque type magnetoresistance effect element is cut along the xz plane passing through the center of a spin-orbit-torque wiring 5 in the y direction. A spin-orbit-torque type magnetoresistance effect element 101 shown in FIG. 1 includes a functional unit 4 and a spin-orbit-torque wiring 5. The functional unit 4 includes a first ferromagnetic layer 1, a second ferromagnetic layer 2, and a non-magnetic layer 3 which is located between the first ferromagnetic layer 1 and the second ferromagnetic layer 2. The spin-orbit-torque wiring 5 extends in a second direction intersecting a first direction corresponding to an orthogonal direction of the first ferromagnetic layer 1. The spin-orbit-torque wiring 5 has the first ferromagnetic layer 1 laminated thereon.

In the present specification, a first direction which is an orthogonal direction of the first ferromagnetic layer 1 is referred to as the z direction, a direction which is orthogonal to the first direction and in which the spin-orbit-torque wiring 5 extends is referred to as the x direction, and a direction which is orthogonal to any one of the x direction and the z direction is referred to as the y direction.

[Functional Unit]

The functional unit 4 functions similarly to a normal magnetoresistance effect element. When the non-magnetic layer 3 is made of an insulator, the functional unit 4 is a tunneling magnetoresistance (TMR) element. Further, when the non-magnetic layer 3 is made of metal, the layer has the same configuration as a giant magnetoresistance (GMR) element. The resistance of the functional unit 4 in the z direction changes according to a difference in the relative angle between the magnetization M1 of the first ferromagnetic layer 1 and the magnetization M2 of the second ferromagnetic layer 2. The orientation of the magnetization M2 of the second ferromagnetic layer 2 is less likely to change than the magnetization of the first ferromagnetic layer 1 when a predetermined external force is applied. The second ferromagnetic layer 2 is called a fixed layer or a reference layer and the first ferromagnetic layer 1 is called a free layer or a storage layer.

The functional unit 4 functions when the magnetization of the second ferromagnetic layer 2 is fixed to one direction (the z direction) and the direction of the magnetization of the first ferromagnetic layer 1 changes relatively. In the case of the application to a coercive force difference type (pseudo spin valve type) MRAM, the coercive force of the second ferromagnetic layer 2 is made larger than the coercive force of the first ferromagnetic layer 1. In the case of the application to an exchange bias type (spin valve type) MRAM, the magnetization of the second ferromagnetic layer 2 is fixed by the exchange coupling with the antiferromagnetic layer.

The functional unit 4 may include a layer other than the first ferromagnetic layer 1, the second ferromagnetic layer 2, and the non-magnetic layer 3. The other layers are, for example, an antiferromagnetic layer for fixing the magnetization direction of the second ferromagnetic layer 2, an underlayer for improving the crystallinity of the functional unit 4, and the like.

(First Ferromagnetic Layer)

The first ferromagnetic layer 1 includes a first laminated structure 10a and an interface magnetic layer 20. In the first ferromagnetic layer 1, the magnetization direction of the interface magnetic layer 20 is changeable. The first laminated structure 10a is a structure in which a ferromagnetic conductor layer 11a and an inorganic compound containing layer 12a are laminated The interface magnetic layer 20 is located between the non-magnetic layer 3 and the inorganic compound containing layer 12a. The interface magnetic layer 20 is in contact with, for example, the non-magnetic layer 3. The ferromagnetic conductor layer 11a is located between the spin-orbit-torque wiring 5 and the inorganic compound containing layer 12a. The ferromagnetic conductor layer 11a is in contact with, for example, the spin-orbit-torque wiring 5.

"Ferromagnetic Conductor Layer"

The ferromagnetic conductor layer 11a contains a ferromagnetic metal element. It is preferable that the conductivity of the ferromagnetic conductor layer 11a is higher than that of the spin-orbit-torque wiring 5. When the conductivity of the ferromagnetic conductor layer 11a is higher than the conductivity of the spin-orbit-torque wiring 5, electrons flowing through the spin-orbit-torque wiring 5 are likely to enter the ferromagnetic conductor layer 11a. Further, the symmetry of the crystal structure of the ferromagnetic conductor layer 11a is broken due to the inorganic compound containing layer 12a. The breaking of the symmetry of the crystal structure breaks the symmetry of the inner field (the distribution of electrons) of the ferromagnetic conductor layer 11a. The inner field of the ferromagnetic conductor layer 1a changes from the state in which the ferromagnetic conductor layer 11a exists alone. For that reason, when electrons enter the ferromagnetic conductor layer 11a, a spin current generated in the ferromagnetic conductor layer 11a increases as compared with a case in which the symmetry of the internal field is not broken. When a spin current generated in the ferromagnetic conductor layer 11a increases, the reversal current density of the spin-orbit-torque type magnetoresistance effect element 101 decreases. Further, the perpendicular magnetic anisotropy (PMA) of the ferromagnetic conductor layer 11a increases when the anion component of the inorganic compound containing layer 12a is coupled to the ferromagnetic element. Then, when the perpendicular magnetic anisotropy (PMA) of the ferromagnetic conductor layer 11a increases, the thermal stability of the ferromagnetic conductor layer 11a is improved.

It is preferable that the ferromagnetic conductor layer 11a is made of Co, Fe, Ni, Ga, or an alloy of these metals. It is preferable that the film thickness of the ferromagnetic conductor layer 11a is in a range of 0.3 nm or more and 2.0 nm or less.

"Inorganic Compound Containing Layer"

The inorganic compound containing layer 12a contains at least one inorganic compound selected from a group consisting of carbides, nitrides, and sulfides. The configuration of the inorganic compound containing layer 12a is not particularly limited as long as the symmetry of the crystal structure of the ferromagnetic conductor layer 11a is broken. The symmetry of the crystal structure of the ferromagnetic conductor layer 11a is broken, for example, by the fact that the anion component deficiency in the inorganic compound containing layer 12a is non-uniform depending on the location in the in-plane direction (in the xy plane). Further, when the amount of the anion component deficiency in the inorganic compound containing layer 12a is also non-uniform in a direction perpendicular to the in-plane direction (within xy plane) (xz direction or yz direction), the symmetry of the crystal structure of the ferromagnetic conductor layer 11a can be broken. Further, the symmetry of the crystal structure may be broken by making a part of the inorganic compound containing layer 12a have an excess anion component and making the amount of the anion component non-uniform in the in-plane direction or the orthogonal direction. The inorganic compound containing layer 12a may be a layer composed of only an inorganic compound or a layer containing a ferromagnetic metal element and an inorganic compound. The layer containing the ferromagnetic metal element and the inorganic compound may have a structure in which the inorganic compound is scattered in an island shape in the ferromagnetic metal element or may have a structure in which particles of the inorganic compound are dispersed in the ferromagnetic metal element.

Preferably, the cationic component in the inorganic compound of the inorganic compound-containing layer 12a is a non-magnetic metal. When the non-magnetic metal elements are light metals with an atomic number of 38 or less, the inorganic compounds of these light metals can form thin and stable inorganic compound containing layer. The relatively small electronegativity of these light metal elements prevents the diffusion of anionic components by heat, and they are stable as inorganic compounds. Among light metal elements with an atomic number of 38 or less, it is preferable to be selected from the group consisting of Mg, Al, Si, Ti, V, Cr, Mn, Cu, Zn, Ga, and Ge. When the nonmagnetic metal element is a heavy metal with an atomic number of 39 or more, the reversal current density required for magnetization reversal of magnetization M1 in the first ferromagnetic layer 1 can be reduced. A part of the current also enters the inorganic compound containing layer 12a. This is because when a current flows through the inorganic compound containing layer 12a containing heavy metals, SOT (torque) is efficiently generated even in the inorganic compound containing layer 12a and contributes to the magnetization reversal of the first ferromagnetic layer 1. Among heavy metal elements with an atomic number of 39 or more, the group consisting of Mo, Ru, Rh, Pd, Ag, Cd, Hf, Ta, W, Re, Os, Ir, Pt, and Au is preferably selected.

The cation component contained in the inorganic compound of the inorganic compound containing layer 12a is preferably a ferromagnetic metal and is particularly preferably the same as the ferromagnetic metal element contained in the ferromagnetic conductor layer 11a. In this case, the adhesion between the inorganic compound containing layer 12a and the ferromagnetic conductor layer 11a is improved and the symmetry of the crystal structure of the ferromagnetic conductor layer 11a is likely to be broken. When the symmetry of the crystal structure of the ferromagnetic conductor layer 11a is broken, the efficiency of generating the spin current in the ferromagnetic conductor layer 11a is improved. The cation component is, for example, Co, Fe, Ni, or Ga.

It is preferable that the inorganic compound contained in the inorganic compound containing layer 12a lacks an anionic component ($C^{4-}$, $N^{3-}$, $S^{2-}$) with respect to the stoichiometric composition. In this case, the spin current supplied from the ferromagnetic conductor layer 11a easily passes through the inorganic compound containing layer 12a and the efficiency of transmitting the spin current to the interface magnetic layer 20 is improved. It is preferable that the inorganic compound is deficient in the anion component in a range of 5 atomic % to 30 atomic % with respect to the stoichiometric composition.

It is preferable that the film thickness of the inorganic compound containing layer 12a is 1.0 nm or less. In this case, since the ferromagnetic conductor layer 11a and the interface magnetic layer 20 are more strongly ferromagnetically coupled, the stability of magnetization against thermal disturbance and the like is increased. Further, when the thickness of the inorganic compound containing layer 12a is small, anion components are scattered and the symmetry of the crystal structure of the ferromagnetic conductor layer 11a is easily broken. For this reason, it is preferable that the film thickness of the inorganic compound containing layer 12a is at least one atomic layer. In the case of one atomic layer, a continuous and uniform layer is not formed, and the inorganic compound is scattered. However, even in this case, this is treated as the inorganic compound containing layer.

"Interface Magnetic Layer"

The interface magnetic layer 20 can be made of a ferromagnetic material, particularly a soft magnetic material.

The interface magnetic layer 20 contains, for example, metals selected from a group consisting of Cr, Mn, Co, Fe, and Ni, alloys containing one or more of these metals, alloys containing these metals and at least one element of B, C, and N, or the like. The interface magnetic layer 20 can be exemplified by, for example, Co—Fe, Co—Fe—B, and Ni—Fe. When the interface magnetic layer 20 is an in-plane magnetic film, the interface magnetic layer 20 is, for example, a Co—Ho alloy ($CoHo_2$), an Sm—Fe alloy ($SmFe_{12}$), or the like.

The interface magnetic layer 20 may be a Heusler alloy such as $Co_2FeSi$. The Heusler alloy contains an intermetallic compound having a chemical composition of XYZ or $X_2YZ$, X is a transition metal element or a noble metal element of Co, Fe, Ni, or Cu group on the periodic table, and Y is a transition metal of Mn, V, Cr or Ti group or an element type of X, and Z is a typical element of Group III to Group V. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has a high spin polarizability and can increase the MR ratio of the functional unit 4.

It is preferable that the interface magnetic layer 20 contains at least one element selected from a group consisting of Co, Fe, and B. It is preferable that the interface magnetic layer 20 is Co—Fe—B. In this case, the MR ratio of the functional unit 4 can be increased.

It is preferable that the film thickness of the interface magnetic layer 20 is in a range of 0.5 nm or more and 3.0 nm or less.

(Non-Magnetic Layer)

Known materials can be used for the non-magnetic layer 3.

For example, when the non-magnetic layer 3 is made of an insulator (in the case of a tunnel barrier layer), the non-magnetic layer 3 is, for example, $Al_2O_3$, $SiO_2$, MgO, $MgAl_2O_4$, or the like. Further, a material in which a part of Al, Si, and Mg is replaced by Zn, Be, or the like can be used for the non-magnetic layer 3. Among them, MgO or $MgAl_2O_4$ can increase the MR ratio of the functional unit 4. When the non-magnetic layer 3 is made of metal, the non-magnetic layer 3 is, for example, Cu, Au, Ag, or the like. Further, when the non-magnetic layer 3 is made of semiconductor, the non-magnetic layer 3 is, for example, Si, Ge, $CuInSe_2$, $CuGaSe_2$, Cu (In, Ga) $Se_2$, or the like.

It is preferable that the film thickness of the non-magnetic layer 3 is in a range of 0.3 nm or more and 3.0 nm or less.

(Second Ferromagnetic Layer)

Known ferromagnetic materials can be used for the material of the second ferromagnetic layer 2. The example of the ferromagnetic material is the same as that of the interface magnetic layer 20. The second ferromagnetic layer 2 may use the same ferromagnetic material as the interface magnetic layer 20 or a different ferromagnetic material from the interface magnetic layer 20.

It is preferable that the film thickness of the second ferromagnetic layer 2 is in a range of 0.5 nm or more and 5.0 nm or less.

[Spin-Orbit-Torque Wiring]

The spin-orbit-torque wiring 5 extends in the x direction. The spin-orbit-torque wiring 5 is located on one surface of the ferromagnetic conductor layer 11a. The spin-orbit-torque wiring 5 may be directly connected to the ferromagnetic conductor layer 11a or may be connected thereto through other layers.

When a current flows to the spin-orbit-torque wiring 5, a spin current is generated due to a spin Hall effect. The spin Hall effect is a phenomenon in which a spin current is induced in a direction orthogonal to the direction of a current based on a spin-orbit interaction when a current flows through a wiring. A mechanism in which a spin current is generated by the spin Hall effect will be described.

As shown in FIG. 1, a current I flows in the x direction when a potential difference is applied to both ends of the spin-orbit-torque wiring 5 in the x direction. When the current I flows, a first spin S1 oriented in the +y direction and a second spin S2 oriented in the −y direction are respectively bent in a direction orthogonal to the current. The normal Hall effect and the spin Hall effect are common in that the moving charges (electrons) can bend the movement (moving) direction. Meanwhile, the normal Hall effect and the spin Hall effect are different in the conditions required for the moving charge (electrons) to bend the movement (moving) direction. In the normal Hall effect, charged particles moving in a magnetic field are subject to the Lorentz force to bend the moving direction. However, the spin Hall effect is largely different in that the moving direction is bent only by the movement of electrons (only the flow of current) without the presence of a magnetic field. In order to eliminate the uneven distribution of the first spin S1 and the second spin S2 caused by the spin Hall effect, a spin current is generated in the z direction.

Since the number of electrons of the first spin S1 is equal to the number of electrons of the second spin S2 in the non-magnetic material (a material that is not a ferromagnetic material), the number of electrons of the first spin S1 going upward is equal to the number of electrons of the second spin S2 going downward in the drawing. For that reason, a current as a net flow of charge is zero. This spin current without this current is particularly called a pure spin current.

Here, if the electron flow of the first spin S1 is represented by $J_\uparrow$, the electron flow of the second spin S2 is represented by $J_\downarrow$, and the spin current is represented by $J_S$, this is defined as $J_S=J_\uparrow-J_\downarrow$. A spin current $J_S$ flows in the z direction of the drawing. In FIG. 1, the first ferromagnetic layer 1 is present on the surface of the spin-orbit-torque wiring 5. Therefore, spin is injected into the first ferromagnetic layer 1.

The spin-orbit-torque wiring 5 is made of a metal, an alloy, an intermetallic compound, a metal boride, a metal carbide, a metal silicide, or a metal phosphide having a function of generating a spin current by a spin Hall effect when a current flows.

The main configuration of the spin-orbit-torque wiring 5 is preferably a non-magnetic heavy metal. Here, the heavy metal means a metal having a specific gravity of yttrium or more. It is preferable that the non-magnetic heavy metal is a non-magnetic metal having an atomic number of 39 or more and having a large atomic number, having d electrons or f electrons in the outermost shell. These non-magnetic metals have a large spin-orbit interaction that causes the spin Hall effect.

Electrons generally move in the opposite direction to the current regardless of their spin direction. On the other hand, a non-magnetic metal of a large atomic number having d electrons or f electrons in the outermost shell has a large spin-orbit interaction and a strong spin Hall effect. Therefore, the electron movement direction depends on the direction of electron spin. Thus, the spin current $J_S$ is likely to occur in such a non-magnetic heavy metal.

Further, the spin-orbit-torque wiring 5 may contain magnetic metal. The magnetic metal refers to ferromagnetic metal or antiferromagnetic metal. When a small amount of magnetic metal is contained in non-magnetic metal, magnetic metal becomes a spin scattering factor. When the spin is scattered, the spin-orbit interaction is enhanced and the efficiency of generating a spin current with respect to the current increases.

Meanwhile, when the added amount of the magnetic metal is too large, the generated spin current is scattered by the added magnetic metal. As a result, the effect of reducing the spin current may be increased. For that reason, it is preferable that the molar ratio of the magnetic metal to be added is sufficiently smaller than the total molar ratio of the elements constituting the spin-orbit-torque wiring. It is preferable that the molar ratio of the magnetic metal to be added is 3% or less of the whole.

The spin-orbit-torque wiring 5 may contain a topological insulator. The topological insulator is a substance in which the inside of a substance is an insulator or a high-resistance substance, but a spin-polarized metal state occurs on its surface. An internal magnetic field is generated in the topological insulator due to the spin-orbit interaction. Here, in the topological insulator, a new topological phase appears due to the effect of the spin-orbit interaction even without an external magnetic field. That is, the topological insulator disturbs the symmetry of the electronic state in the direction from the inside to the surface even without an external magnetic field. The topological insulator can generate a pure spin current with high efficiency due to the strong spin-orbit interaction and the breakage of the reversal symmetry at edges.

Preferred examples of the topological insulator include $SnTe$, $Bi_{1.5}Sb_{0.5}Te_{1.7}Se_{1.3}$, $TlBiSe_2$, $Bi_2Te_3$, $Bi_{1-x}Sb_x$, and $(Bi_{1-x}Sbx)_2Te_3$. These topological insulators can generate a spin current with high efficiency.

(Spin-Orbit-Torque Type Magnetoresistance Effect Element Manufacturing Method)

For example, the spin-orbit-torque type magnetoresistance effect element 101 can be manufactured by laminating the ferromagnetic conductor layer 11a, the inorganic compound containing layer 12a, the interface magnetic layer 20, the non-magnetic layer 3, and the second ferromagnetic layer 2 in order from the spin-orbit-torque wiring 5. Hereinafter, in the present specification, the layers laminated on the spin-orbit-torque wiring 5 may be collectively referred to as a laminated body. As a method of laminating the ferromagnetic conductor layer 11a, the interface magnetic layer 20, the non-magnetic layer 3, and the second ferromagnetic layer 2, known methods such as a sputtering method and a chemical vapor deposition (CVD) method can be used. As a method of laminating the inorganic compound containing layer 12a, for example, a method of forming a ferromagnetic metal film by a sputtering method or a CVD method and then carbonizing, nitriding, or sulfurizing the obtained ferromagnetic metal film or a method of co-sputtering a ferromagnetic metal and an inorganic compound can be used.

It is preferable that the obtained laminated body is subjected to an annealing treatment. When the annealing treatment is performed, the crystallinity of each layer is improved and the MR ratio of the functional unit 4 can be increased.

As the annealing treatment, it is preferable that the laminated body is heated at a temperature of 300° C. or more and 500° C. or less for 5 minutes or more and 100 minutes or less in the presence of an inert atmosphere such as Ar and then is heated at a temperature of 100° C. or more and 500° C. or less for 1 hour or more and 10 hours or less while a magnetic field of 2 kOe or more and 10 kOe or less is applied thereto.

The spin-orbit-torque type magnetoresistance effect element 101 with the above-described configuration according to the embodiment can quickly reduce reversal current density since a spin current is generated in the ferromagnetic conductor layer 11a.

Figure 2:
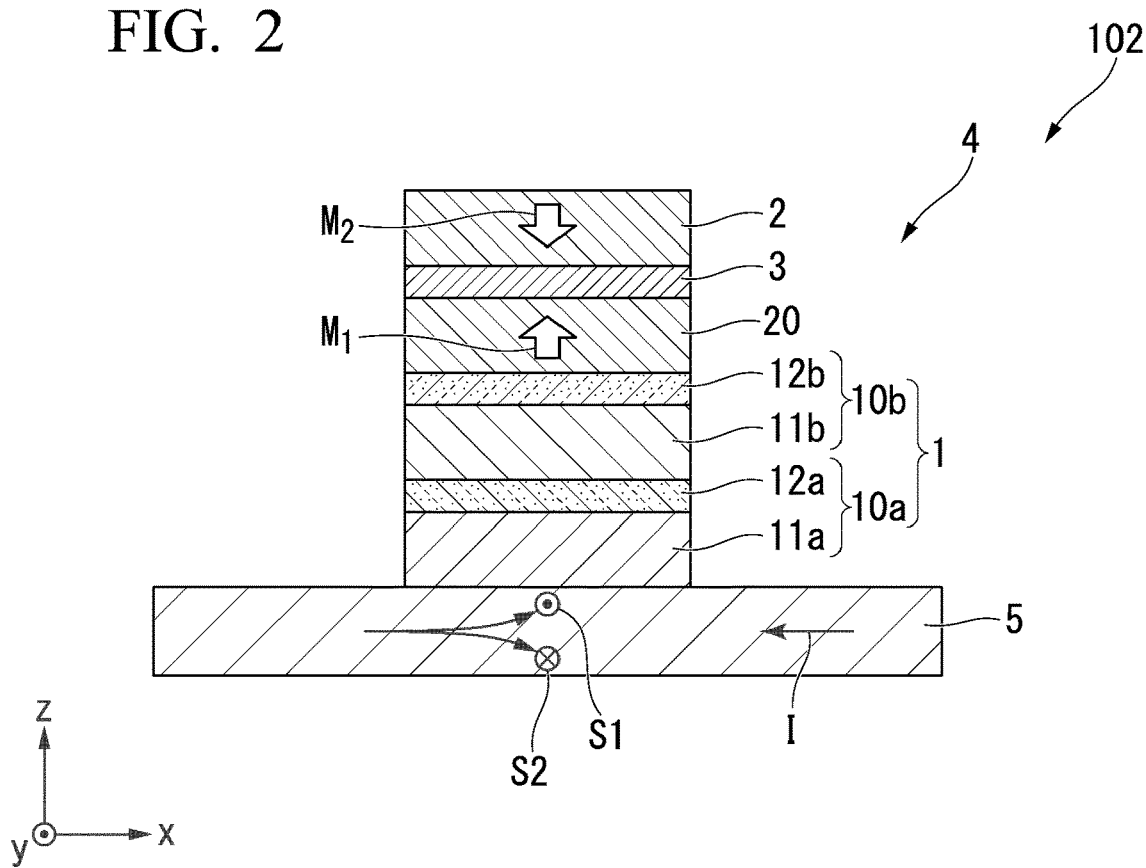
FIG. 2 is a schematic cross-sectional view of a spin-orbit-torque type magnetoresistance effect element according to Modified Example 1.

FIG. 2 is a schematic cross-sectional view of a spin-orbit-torque type magnetoresistance effect element according to Modified Example 1. FIG. 2 shows a cross-section in which a spin-orbit-torque type magnetoresistance effect element is cut along the xz plane passing through the center of the spin-orbit-torque wiring 5 in the y direction. A spin-orbit-torque type magnetoresistance effect element 102 shown in FIG. 2 is the same as the spin-orbit-torque type magnetoresistance effect element 101 shown in FIG. 1 except that a second laminated structure 10b is inserted between the first laminated structure 10a and the interface magnetic layer 20. For this reason, the same reference numerals will be given to the same configurations as those of the spin-orbit-torque type magnetoresistance effect element 101 and a description thereof will be omitted.

The second laminated structure 10b is a structure in which a ferromagnetic conductor layer 11b and an inorganic compound containing layer 12b are laminated. The ferromagnetic conductor layer 11b is located between the inorganic compound containing layer 12a and the inorganic compound containing layer 12b. The ferromagnetic conductor layer 11b is in contact with, for example, the inorganic compound containing layer 12a of the first laminated structure 10a. The inorganic compound containing layer 12b is in contact with the interface magnetic layer 20.

It is preferable that the film thickness of the ferromagnetic conductor layer 11b of the second laminated structure 10b is thinner than the film thickness of the ferromagnetic conductor layer 11a of the first laminated structure 10a. When the film thickness of the ferromagnetic conductor layer 11a of the first laminated structure 10a contacting the spin-orbit-torque wiring 5 is set to be relatively larger than that of the ferromagnetic conductor layer 11b, the ferromagnetic conductor layer 11a can be set as an in-plane magnetization film. Meanwhile, when the film thickness of the ferromagnetic conductor layer 11b of the second laminated structure 10b separated from the spin-orbit-torque wiring 5 is set to be relatively thinner than that of the ferromagnetic conductor layer 11a, the magnetization of the ferromagnetic conductor layer 11b can be set as the perpendicular magnetization. In this case, when the ferromagnetic conductor layer 11a and the ferromagnetic conductor layer 11b having different magnetization orientation directions move close to each other, the magnetization state of the entire first ferromagnetic layer 1 can be inclined with respect to the z direction. When the magnetization direction of the first ferromagnetic layer 1 is inclined with respect to the z direction, the symmetry of the magnetization is broken and hence the magnetization reversal without a magnetic field becomes possible. It is preferable that the film thickness of the ferromagnetic conductor layer 11b of the second laminated structure 10b is in a range of 50% or more and 90% or less with respect to the film thickness of the ferromagnetic conductor layer 11a of the first laminated structure 10a.

It is preferable that the film thickness of the inorganic compound containing layer 12b of the second laminated structure 10b is 1.0 nm or less similarly to the first laminated structure 10a.

The spin-orbit-torque type magnetoresistance effect element 102 can be manufactured similarly to the case of the spin-orbit-torque type magnetoresistance effect element 101 except that the ferromagnetic conductor layer 11b and the inorganic compound containing layer 12b are laminated between the inorganic compound containing layer 12a and the interface magnetic layer 20. The ferromagnetic conductor layer 11b and the inorganic compound containing layer 12b of the second laminated structure 10b can be laminated similarly to the case of the ferromagnetic conductor layer 11a and the inorganic compound containing layer 12a of the first laminated structure 10a.

In the spin-orbit-torque type magnetoresistance effect element 102 with the above-described configuration, since a spin current is generated in the ferromagnetic conductor layer 11b of the second laminated structure 10b in addition to the ferromagnetic conductor layer 11a of the first laminated structure 10a, the reversal current density can be further reduced. Additionally, in the spin-orbit-torque type magnetoresistance effect element 102 shown in FIG. 2, one second laminated structure 10b is inserted between the first laminated structure 10a and the interface magnetic layer 20, but the number of the second laminated structures 10b is not particularly limited and may be two or more. When two or more second laminated structures 10b are inserted, it is preferable that the film thickness of the ferromagnetic conductor layer 11b close to the spin-orbit-torque wiring 5 is thick.

Figure 3:
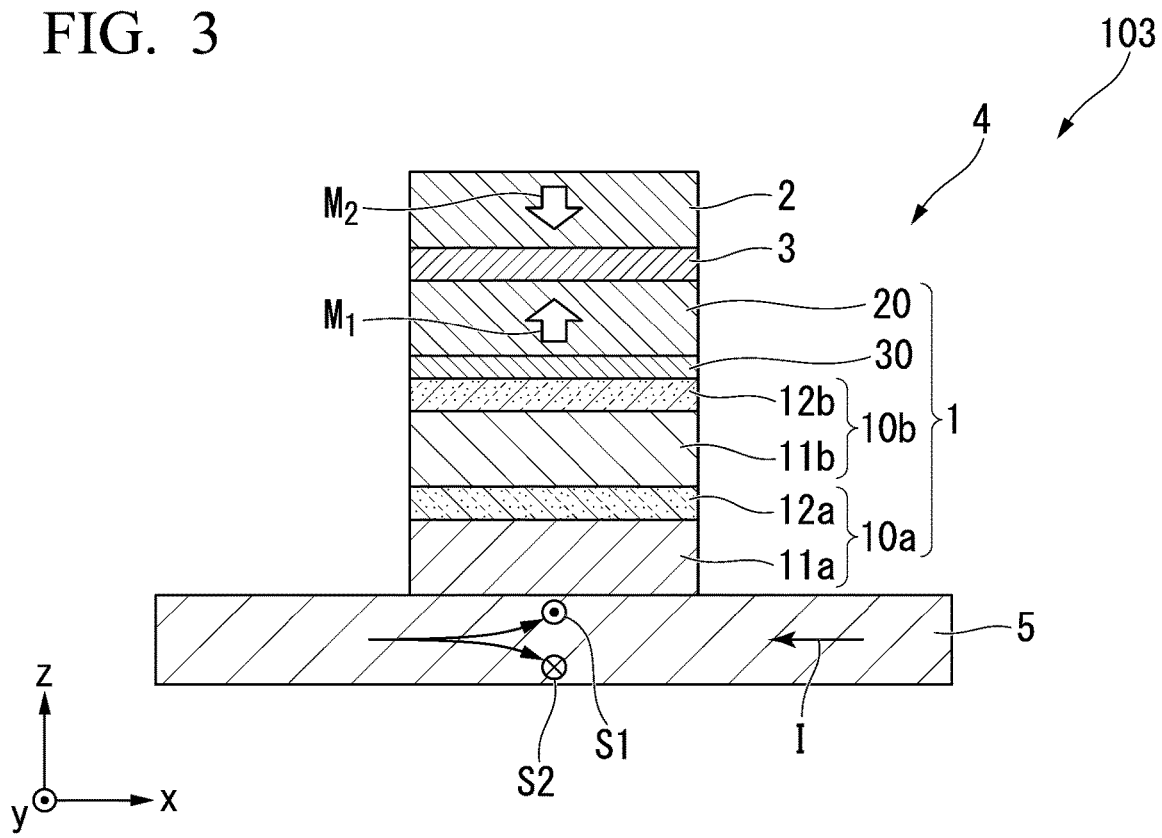
FIG. 3 is a schematic cross-sectional view of a spin-orbit-torque type magnetoresistance effect element according to Modified Example 2.

FIG. 3 is a schematic cross-sectional view of a spin-orbit-torque type magnetoresistance effect element according to Modified Example 2. FIG. 3 shows a cross-section in which a spin-orbit-torque type magnetoresistance effect element is cut along the xz plane passing through the center of the spin-orbit-torque wiring 5 in the y direction. A spin-orbit-torque type magnetoresistance effect element 103 shown in FIG. 3 is the same as the spin-orbit-torque type magnetoresistance effect element 102 shown in FIG. 2 except that the first ferromagnetic layer 1 includes the diffusion preventing layer 30. For this reason, the same reference numerals will be given to the same configurations as those of the spin-orbit-torque type magnetoresistance effect element 102 and a description thereof will be omitted.

The diffusion preventing layer 30 is in contact with the surface (the lower surface of FIG. 3) opposite to the contact side to the non-magnetic layer 3 in the interface magnetic layer 20. The diffusion preventing layer 30 is located, for example, between the interface magnetic layer 20 and the second laminated structure 10b. For example, in a high-temperature environment such as when an annealing treatment is performed during the manufacturing of the spin-orbit-torque type magnetoresistance effect element 103, the diffusion preventing layer 30 suppresses the element contained in the interface magnetic layer 20 from diffusing into the inorganic compound containing layer 12b.

It is preferable that the diffusion preventing layer 30 contains a non-magnetic element. The non-magnetic element is, for example, Mo, Ru, Rh, Pd, Ag, Hf, Ta, W, Re, Ir, Pt, or Au. The diffusion preventing layer 30 may contain one of these elements alone or may contain two or more of these elements in combination. Further, it is preferable that the thickness of the diffusion preventing layer 30 is twice or more the diameter of the element constituting the diffusion preventing layer 30. When a heavy metal element with such a thickness is formed, the heavy metal element is strictly scattered like islands. Thus, the diffusion preventing layer 30 is a mixed layer of a part of the upper layer or the lower layer and a non-magnetic element.

It is preferable that the film thickness of the diffusion preventing layer 30 is in a range of 0.3 nm or more and 2.0 nm or less.

The spin-orbit-torque type magnetoresistance effect element 103 can be manufactured similarly to the case of the spin-orbit-torque type magnetoresistance effect element 102 except that the diffusion preventing layer 30 is laminated between the inorganic compound containing layer 12b and the interface magnetic layer 20. As a method of laminating the diffusion preventing layer 30, known methods such as a sputtering method and a chemical vapor deposition (CVD) method can be used.

Since a spin current is generated in the ferromagnetic conductor layer 11a, the spin-orbit-torque type magnetoresistance effect element 103 with the above-described configuration can reduce the reversal current density. Further, since the spin-orbit-torque type magnetoresistance effect element 103 includes the diffusion preventing layer 30, elements contained in the interface magnetic layer 20 hardly diffuse into the inorganic compound containing layer 12b even in a high-temperature environment. For this reason, since the inorganic compound containing layer 12b is stabilized for a long period of time, the spin-orbit-torque type magnetoresistance effect element 103 is stabilized for a long period of time and hence the reversal current density can be reduced.

Figure 4:
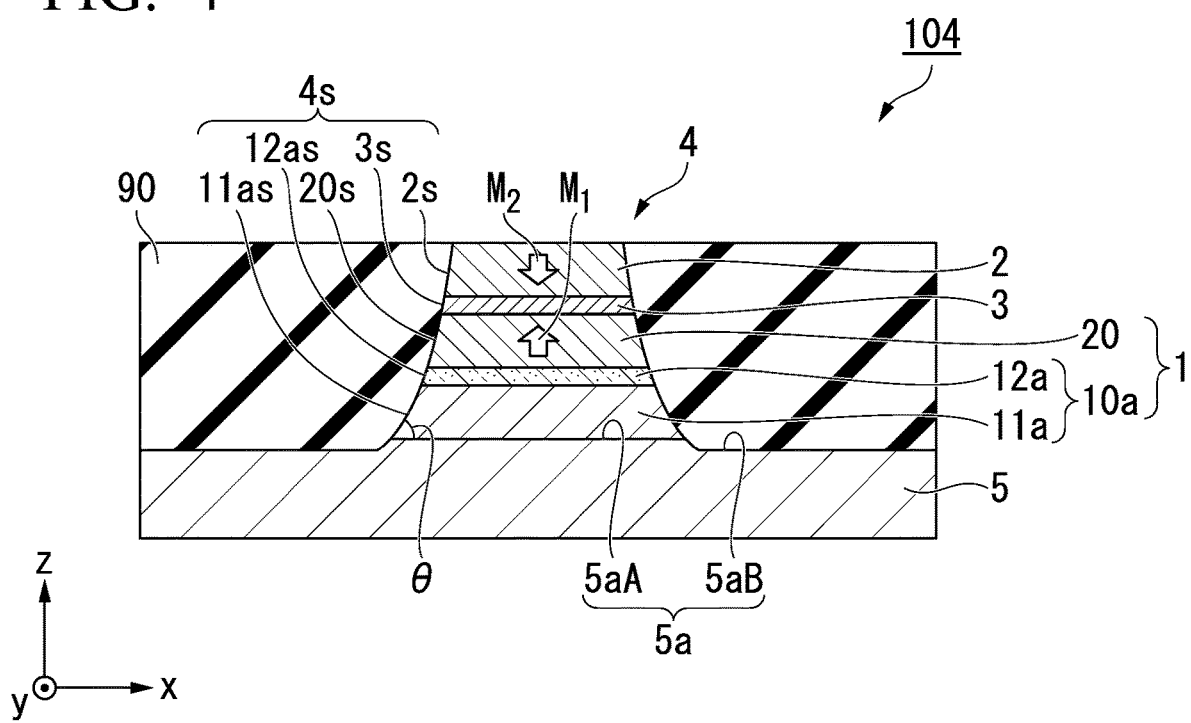
FIG. 4 is a schematic cross-sectional view of a spin-orbit-torque type magnetoresistance effect element according to Modified Example 3.
Figure 5:
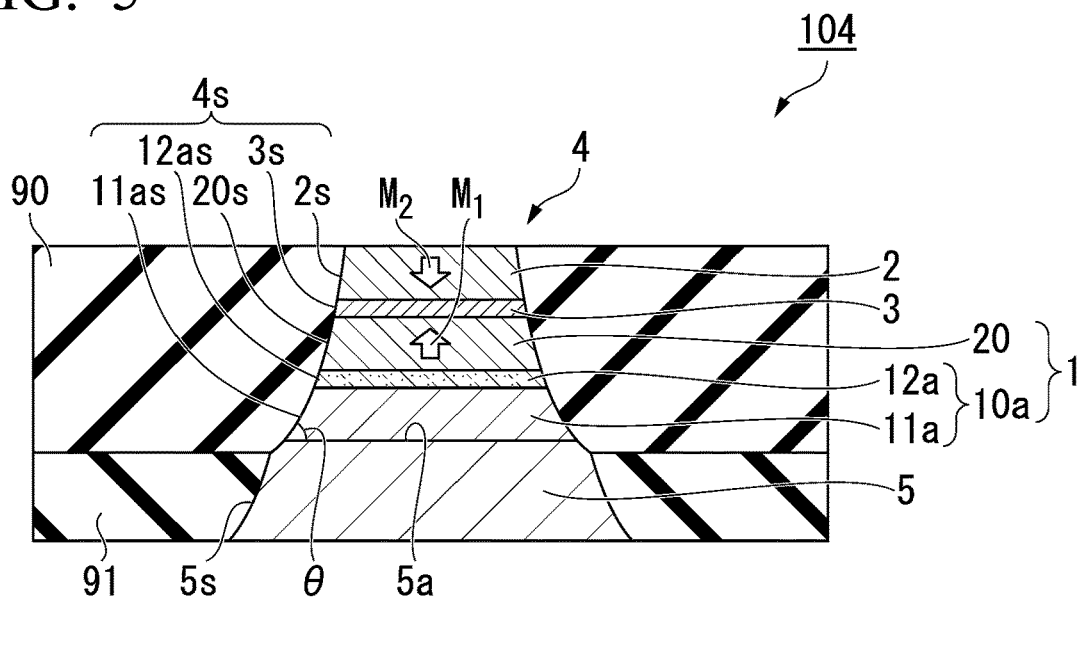
FIG. 5 is a schematic cross-sectional view in which the spin-orbit-torque type magnetoresistance effect element according to Modified Example 3 is cut along another plane.

FIGS. 4 and 5 are schematic cross-sectional views of a spin-orbit-torque type magnetoresistance effect element 104 according to Modified Example 3. FIG. 4 shows a cross-section in which the spin-orbit-torque type magnetoresistance effect element 104 is cut along the xz plane passing through the center of the spin-orbit-torque wiring 5 in the y direction. FIG. 5 shows a cross-section in which the spin-orbit-torque type magnetoresistance effect element 104 is cut along the yz plane passing through the center of the functional unit 4 in the x direction. The spin-orbit-torque type magnetoresistance effect element 104 shown in FIGS. 4 and 5 is the same as the spin-orbit-torque type magnetoresistance effect element 101 except that the shape of the side surface of the functional unit 4 and the shape of the first surface 5a of the spin-orbit-torque wiring 5 are different. For this reason, the same reference numerals will be given to the same configurations as those of the spin-orbit-torque type magnetoresistance effect element 101 and a description thereof will be omitted.

The functional unit 4 shown in FIGS. 4 and 5 spreads in the xy plane as it goes toward the spin-orbit-torque wiring 5 when viewed from the z direction. When viewed from the z direction, the outer peripheral length or the outer diameter of the functional unit 4 increases as it goes toward the spin-orbit-torque wiring 5. Further, a side surface 4s of the functional unit 4 is inclined with respect to the xy plane when viewed from the x direction or the y direction. An inclination angle θ of the side surface 4s with respect to the xy plane may be different or constant in accordance with the height position in the z direction. The inclination angle θ of the side surface 4s with respect to the xy plane decreases, for example, as it goes toward the spin-orbit-torque wiring 5.

The side surface 4s of the functional unit 4 includes side surfaces 2s, 3s, 20s, 12as, and 11as of the second ferromagnetic layer 2, the non-magnetic layer 3, the interface magnetic layer 20, the inorganic compound containing layer 12a, and the ferromagnetic conductor layer 11a. Each of the side surfaces 2s, 3s, 20s, 12as, and 11as is inclined with respect to the xy plane. The side surfaces 2s, 3s, 20s, 12as, and 11as are respectively continuous so as to form one side surface 4s. Here, "continuous" means that the inclination of a tangent drawn along the side surface 4s is constant or changes continuously in a cut plane cut in the xz plane or the yz plane.

Further, the height position of the first surface 5a of the spin-orbit-torque wiring 5 in the z direction is different depending on a location. The first surface 5a is a surface near the functional unit 4 in the spin-orbit-torque wiring 5. Hereinafter, a portion overlapping the functional unit 4 in the z direction in the first surface 5a is referred to as a first surface 5aA and a non-overlapping portion is referred to as a first surface 5aB. The first surface 5aA is located at a position in the +z direction in relation to the first surface 5aB. That is, the first surface 5aA is located at a position separated from a substrate Sub to be described later in relation to the first surface 5aB. The first surface 5aB may be formed at a position in the −z direction from the first surface 5aA by ion milling or the like when the functional unit 4 is processed into a predetermined shape.

Further, as shown in FIG. 5, the side surface 5s of the spin-orbit-torque wiring 5 is inclined with respect to the xy plane. The side surface 5s and the side surface 4s are, for example, discontinuous. "Discontinuous" means that the inclination of the tangent drawn along the side surfaces 5s and 4s does not change continuously in the cut plane cut in the xz plane or the yz plane. When processing the functional unit 4 into a predetermined shape after processing the spin-orbit-torque wiring 5 into a predetermined shape, the side surface 5s and the side surface 4s may be discontinuous.

Further, FIGS. 4 and 5 simultaneously show insulating layers 90 and 91 surrounding the peripheries of the functional unit 4 and the spin-orbit-torque wiring 5. The insulating layers 90 and 91 are insulating layers that insulate between multilayer wirings and between elements. The insulating layers 90 and 91 are made of, for example, silicon oxide (SiOx), silicon nitride (SiNx), silicon carbide (SiC), chromium nitride, silicon carbonitride (SiCN), silicon oxynitride (SiON), aluminum oxide ($Al_2O_3$), zirconium oxide (ZrOx), or the like.

In the spin-orbit-torque type magnetoresistance effect element 104 with the above-described configuration, since a spin current is generated in the ferromagnetic conductor layer 11a, the reversal current density can be reduced. Further, since the side surface 11as of the ferromagnetic conductor layer 11a is inclined with respect to the xy plane, the flow of the current from the spin-orbit-torque wiring 5 to the ferromagnetic conductor layer 11a is smooth. That is, the spin-orbit-torque type magnetoresistance effect element 104 can suppress a current loss due to a rapid change in current density.

Figure 6:
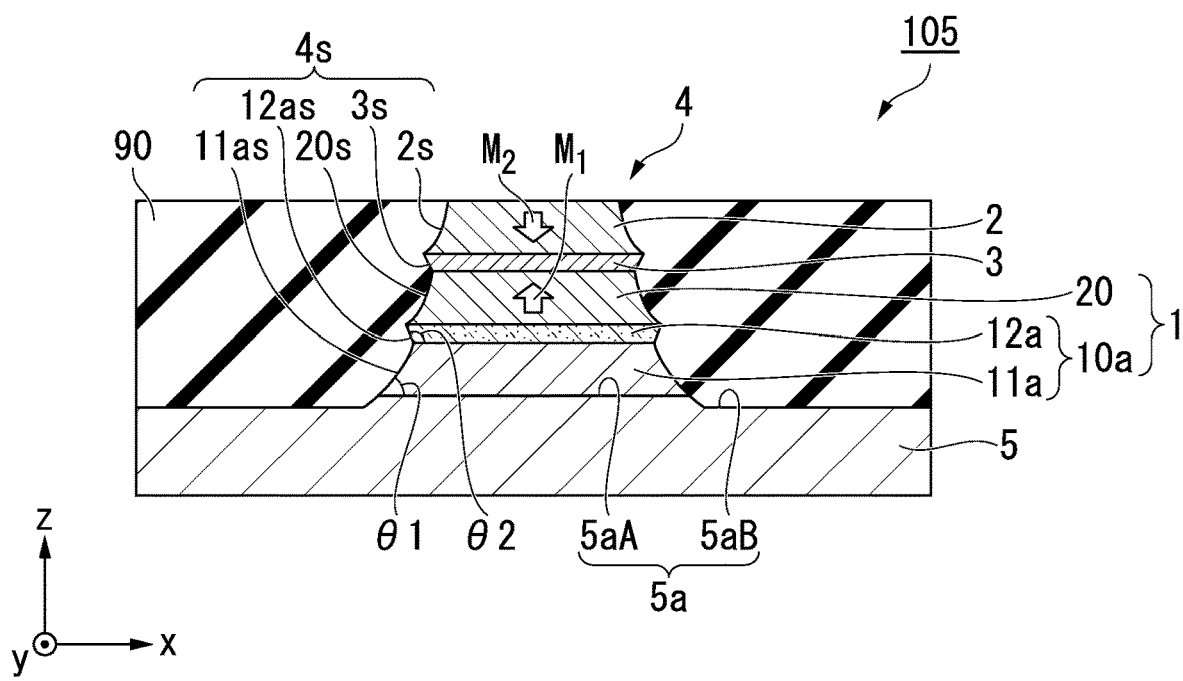
FIG. 6 is a schematic cross-sectional view of a spin-orbit-torque type magnetoresistance effect element according to Modified Example 4.

FIG. 6 is a schematic cross-sectional view of a spin-orbit-torque type magnetoresistance effect element 105 according to Modified Example 4. FIG. 6 shows a cross-section in which the spin-orbit-torque type magnetoresistance effect element 105 is cut along the xz plane passing through the center of the spin-orbit-torque wiring 5 in the y direction. The spin-orbit-torque type magnetoresistance effect element 105 shown in FIG. 6 is the same as the spin-orbit-torque type magnetoresistance effect element 104 according to Modified Example 3 except that the shape of the side surface of the functional unit 4 is different. For this reason, the same reference numerals will be given to the same configurations as those of the spin-orbit-torque type magnetoresistance effect element 104 and a description thereof will be omitted.

The functional unit 4 shown in FIG. 6 gradually spreads within the xy plane as it goes toward the spin-orbit-torque wiring 5 when viewed from the z direction. The outer peripheral length or the outer diameter of each of the second ferromagnetic layer 2, the interface magnetic layer 20, and the ferromagnetic conductor layer 11a which are made of metal in the functional unit 4 shown in FIG. 6 increases as it goes toward the spin-orbit-torque wiring 5. The outer peripheral length or the outer diameter of each of the non-magnetic layer 3 and the inorganic compound containing layer 12a which are made of a material other than metal in the functional unit 4 shown in FIG. 6 decreases as it goes toward the spin-orbit-torque wiring 5.

The side surfaces 2s, 20s, and 11as of the second ferromagnetic layer 2, the interface magnetic layer 20, and the ferromagnetic conductor layer 11a are inclined by, for example, an inclination angle θ1 with respect to the xy plane. The side surfaces 3s and 12as of the non-magnetic layer 3 and the inorganic compound containing layer 12a are inclined by, for example, an inclination angle θ2 with respect to the xy plane. The inclination angles θ1 and θ2 may be different or constant in accordance with the height position in the z direction. The inclination angle θ1 and the inclination angle θ2 are different from each other. The inclination angle θ1 is, for example, less than 90° and the inclination angle θ2 is, for example, 90° or more.

The side surface 4s of the functional unit 4 is discontinuous. The side surface 4s at the boundary of the side surfaces 2s, 3s, 20s, 12as, and 11as of respective layers is discontinuous. The side surface 4s has, for example, a step at the boundary between the second ferromagnetic layer 2 and the non-magnetic layer 3, the boundary between the non-magnetic layer 3 and the interface magnetic layer 20, the boundary between the interface magnetic layer 20 and the inorganic compound containing layer 12a, and the boundary between the inorganic compound containing layer 12a and the ferromagnetic conductor layer 11a.

When forming the functional unit 4, ion milling (side milling) or the like may be performed from the x direction or the y direction after processing from the z direction through a mask. When the side milling is performed, the width of the functional unit 4 in the x direction and the y direction can be decreased and hence the size of the functional unit 4 can be made fine. The degree of side milling depends on the material of the layer. Metals are often softer than non-metals and side milling may progress more with metals than with non-metals. Due to a difference in the degree of progress of the side milling of each layer, the side surface 4s of the functional unit 4 becomes discontinuous.

In the spin-orbit-torque type magnetoresistance effect element 105 with the above-described configuration, since a spin current is generated in the ferromagnetic conductor layer 11a, the reversal current density can be reduced. Further, since the side surface 11as of the ferromagnetic conductor layer 11a is inclined with respect to the xy plane, the flow of the current from the spin-orbit-torque wiring 5 to the ferromagnetic conductor layer 11a is smooth. Furthermore, when the side surface 4s is discontinuous, the adhesion to the insulating layer 90 can be improved.

Figure 7:
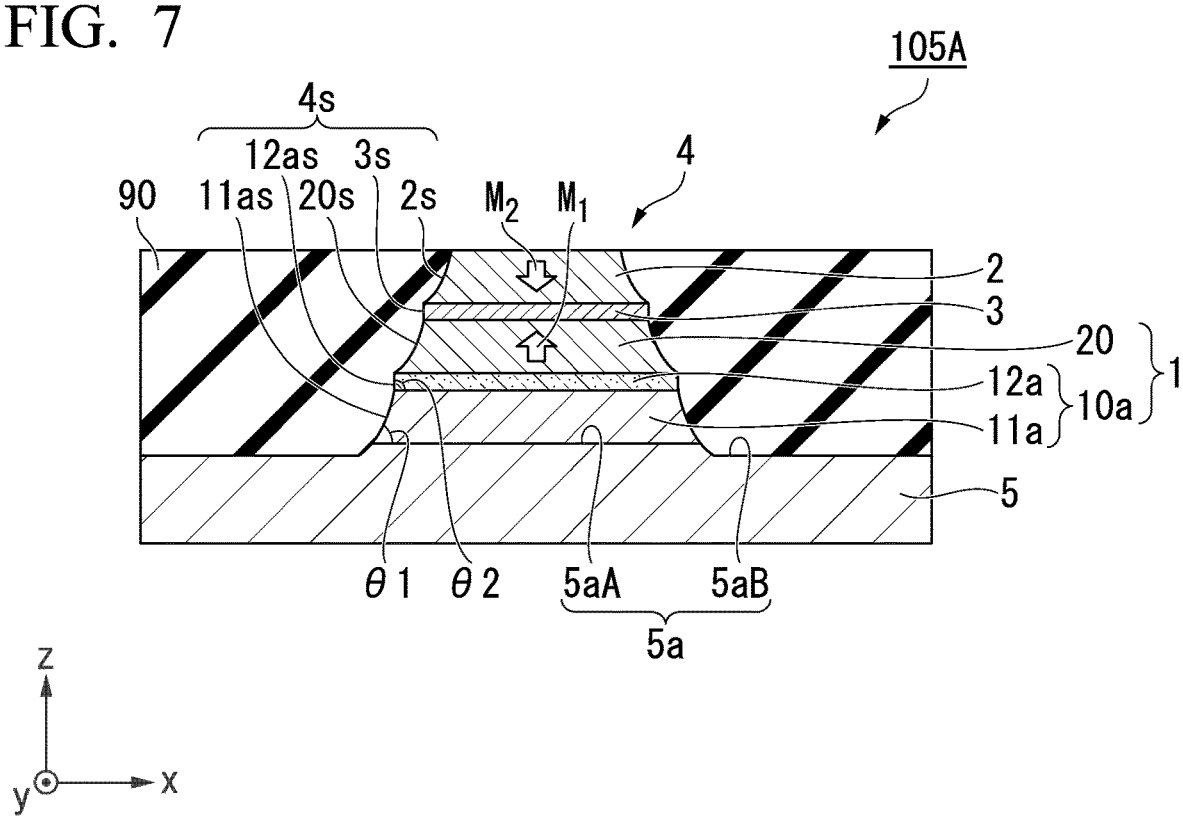
FIG. 7 is a schematic cross-sectional view of another example of the spin-orbit-torque type magnetoresistance effect element according to Modified Example 4.

Further, FIG. 7 is a schematic cross-sectional view of another example of the spin-orbit-torque type magnetoresistance effect element according to Modified Example 4. FIG. 7 shows a cross-section in which a spin-orbit-torque type magnetoresistance effect element 105A is cut along the xz plane passing through the center of the spin-orbit-torque wiring 5 in the y direction. The spin-orbit-torque type magnetoresistance effect element 105A is an example of a case in which an inclination angle θ2 is 90°.

Figure 8:
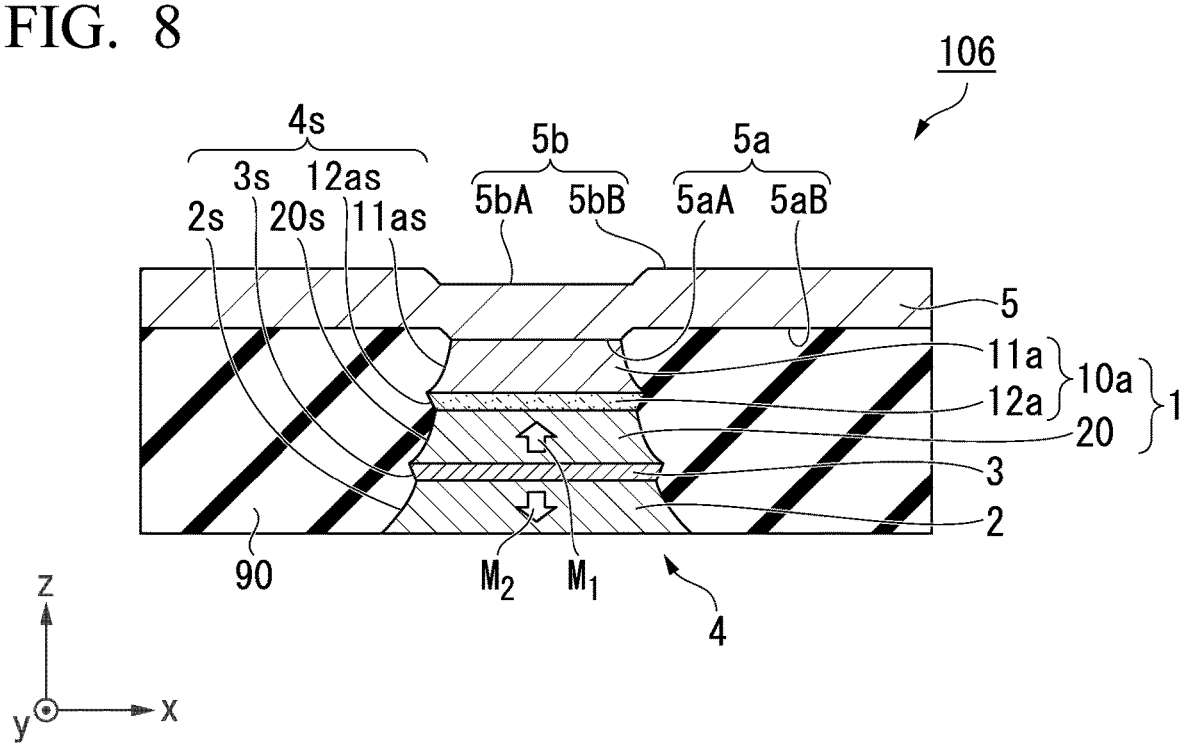
FIG. 8 is a schematic cross-sectional view of a spin-orbit-torque type magnetoresistance effect element according to Modified Example 5.

FIG. 8 a schematic cross-sectional view of a spin-orbit-torque type magnetoresistance effect element 106 according to Modified Example 5. FIG. 8 shows a cross-section in which the spin-orbit-torque type magnetoresistance effect element 106 is cut along the xz plane passing through the center of the spin-orbit-torque wiring 5 in the y direction. The spin-orbit-torque type magnetoresistance effect element 106 shown in FIG. 8 is the same as the spin-orbit-torque type magnetoresistance effect element 105 shown in FIG. 6 except that a positional relationship between the functional unit 4 and the spin-orbit-torque wiring 5 is different. For this reason, the same reference numerals will be given to the same configurations as those of the spin-orbit-torque type magnetoresistance effect element 105 and a description thereof will be omitted.

In the spin-orbit-torque type magnetoresistance effect element 106, the spin-orbit-torque wiring 5 is located in the +z direction with respect to the functional unit 4. That is, the spin-orbit-torque wiring 5 is located at a position separated from the substrate Sub to be described later in relation to the functional unit 4.

The functional unit 4 includes the second ferromagnetic layer 2, the non-magnetic layer 3, the interface magnetic layer 20, the inorganic compound containing layer 12a, and the ferromagnetic conductor layer 11a in order in the +z direction. The second ferromagnetic layer 2 is located at a position near the substrate Sub to be described later in relation to the first ferromagnetic layer 1. The functional unit 4 may be called a bottom pin structure.

The spin-orbit-torque wiring 5 is laminated at the position of the functional unit 4 and the insulating layer 90 in the +z direction. The height positions of the first surface 5a and the second surface 5b of the spin-orbit-torque wiring 5 in the z direction are different depending on a location. The first surface 5a is a surface near the functional unit 4 in the spin-orbit-torque wiring 5 and the second surface 5b is a surface on the side opposite to the first surface 5a. Hereinafter, a portion overlapping the functional unit 4 in the z direction in the first surface 5a is referred to as a first surface 5aA and a non-overlapping portion is referred to as a first surface 5aB. Hereinafter, a portion overlapping the functional unit 4 in the z direction in the second surface 5b is referred to as a second surface 5bA and a non-overlapping operation is referred to as a second surface 5bB. The first surface 5aB is located at a position in the +z direction in relation to the first surface 5aA. The first surface 5aA is recessed in the −z direction with respect to the first surface 5aB due to a difference in polishing speed when the first surface 5a is subjected to, for example, chemical mechanical polishing (CMP). The second surface 5aB is located at a position in the +z direction in relation to the second surface 5aA. The second surface 5b reflects the shape of the first surface 5a.

The spin-orbit-torque type magnetoresistance effect element 106 with the above-described configuration can reduce the reversal current density since a spin current is generated in the ferromagnetic conductor layer 11a even in a bottom pin structure.

Second Embodiment (Magnetic Memory)

Figure 9:
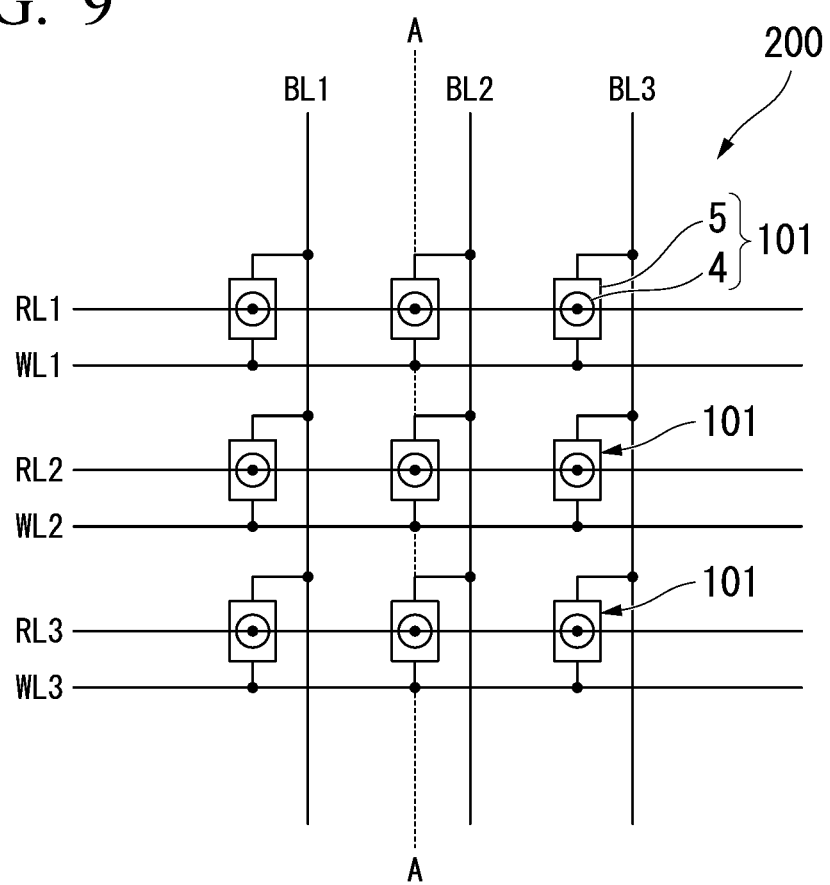
FIG. 9 is a schematic view of a magnetic memory according to a second embodiment.

FIG. 9 is a schematic view of a magnetic memory 200. The magnetic memory 200 includes a plurality of the spin-orbit-torque type magnetoresistance effect elements 101 of the first embodiment (see FIG. 1). FIG. 1 corresponds to a part of a cross-sectional view in which the spin-orbit-torque type magnetoresistance effect element 101 is cut along a plane A-A of FIG. 9. In the magnetic memory 200 shown in FIG. 9, the spin-orbit-torque type magnetoresistance effect elements 101 are arranged in a 3×3 matrix. FIG. 9 is an example of the magnetic memory and the configuration, number, and arrangement of the spin-orbit-torque type magnetoresistance effect element 101 are optional.

One of word lines WL1 to WL3, one of bit lines BL1 to BL3, and one of read lines RL1 to RL3 are respectively connected to the spin-orbit-torque type magnetoresistance effect element 101.

When a voltage difference of a predetermined value or more is applied across the word lines WL1 to WL3 and the bit lines BL1 to BL3, a current flows to the spin-orbit-torque wiring 5 of an arbitrary spin-orbit-torque type magnetoresistance effect element 101 so that a writing operation is performed. Further, when a voltage difference of a predetermined value or more is applied across the read lines RL1 to RL3 and the bit lines BL1 to BL3, a current flows in the lamination direction of the functional unit 4 of an arbitrary spin-orbit-torque type magnetoresistance effect element 101 so that a reading operation is performed. When data of an arbitrary element is read out from the plurality of spin-orbit-torque type magnetoresistance effect elements 101, the element can be used as a magnetic memory.

Figure 10:
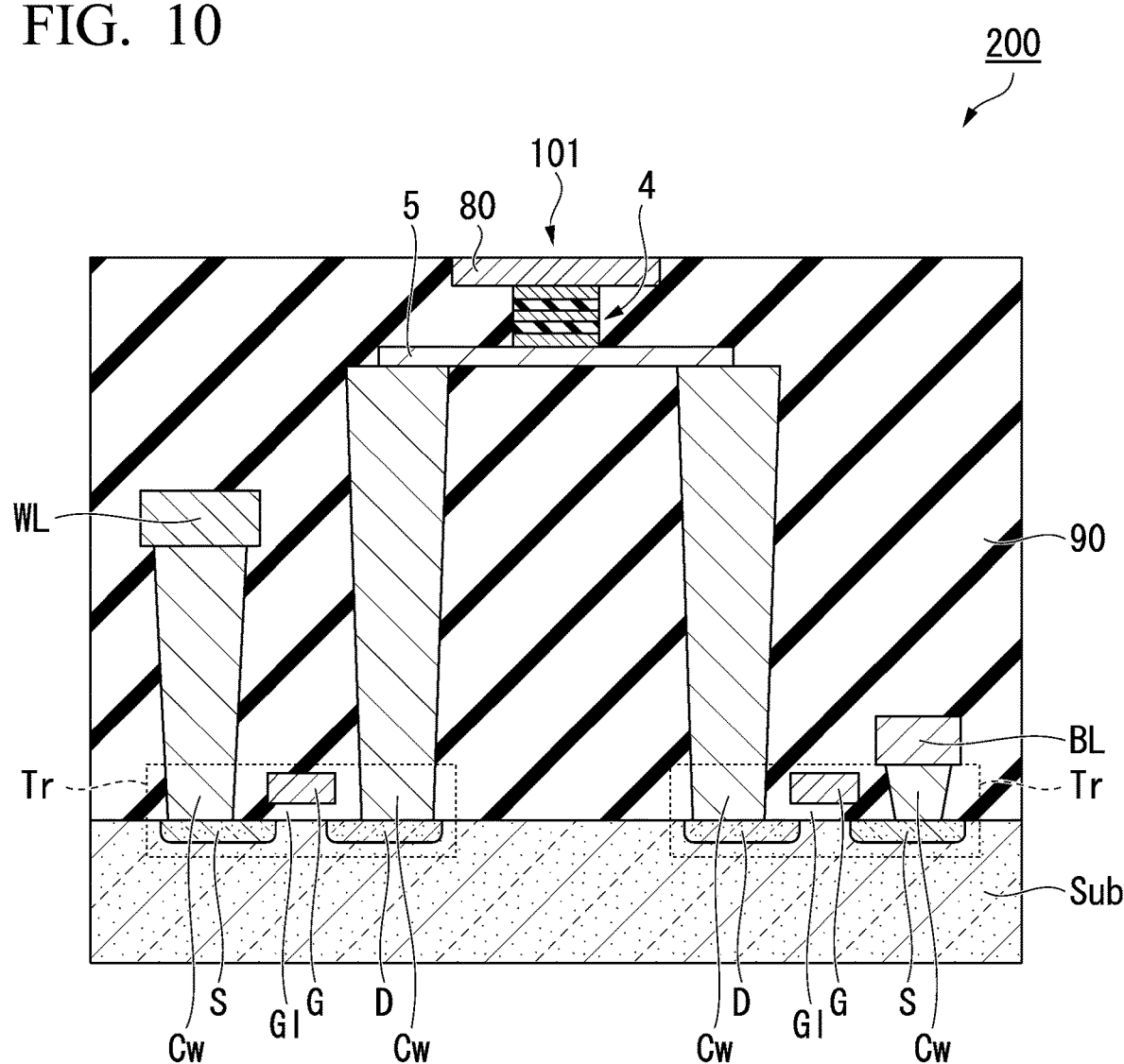
FIG. 10 is a schematic cross-sectional view of a main part of the magnetic memory according to the second embodiment.

Further, FIG. 10 is a cross-sectional view showing a main part of the magnetic memory 200 shown in FIG. 9 when taken along a plane A-A. The magnetic memory 200 includes the spin-orbit-torque type magnetoresistance effect element 101 and a plurality of switching elements connected to the spin-orbit-torque type magnetoresistance effect element 101.

The switching element shown in FIG. 10 is a transistor Tr. The transistor Tr includes a gate electrode G, a gate insulating film GI, and a source region S and a drain region D formed on the substrate Sub. The substrate Sub is, for example, a semiconductor substrate.

Each transistor Tr is electrically connected to the spin-orbit-torque type magnetoresistance effect element 101, the word line WL, and the bit line BL via a conductive portion Cw. The conductive portion Cw may be referred to as, for example, a connection wiring or a via wiring. The conductive portion Cw contains a conductive material. The conductive portion Cw extends in the z direction.

Further, the functional unit 4 of the spin-orbit-torque type magnetoresistance effect element 101 is provided with an electrode 80. The electrode 80 contains a conductive material. The electrode 80 is connected to the read line RL. A switching element (for example, a transistor) may be provided between the read line RL and the electrode 80. The switching element between the read line RL and the electrode 80 is located, for example, in the depth direction (−y direction) in FIG. 10.

The storage element 100 and the transistor Tr are electrically separated by the insulating layer 90 except for the conductive portion Cw.

The magnetic memory 200 according to the second embodiment includes a plurality of the spin-orbit-torque type magnetoresistance effect elements 101 according to the first embodiment. As described above, the reversal current density of each of the spin-orbit-torque type magnetoresistance effect elements 101 is small. Thus, the magnetic memory 200 can be driven quickly with low power consumption.

REFERENCE SIGNS LIST

1 First ferromagnetic layer
2 Second ferromagnetic layer
3 Non-magnetic layer
4 Functional unit
5 Spin-orbit-torque wiring
10a First laminated structure
10b Second laminated structure
11a, 11b Ferromagnetic conductor layer
12a, 12b Inorganic compound containing layer
20 Interface magnetic layer
30 Diffusion preventing layer
101, 102, 103, 104, 105, 106 Spin-orbit-torque type magnetoresistance effect element
200 Magnetic memory

What is claimed is:

1. A spin-orbit-torque type magnetoresistance effect element comprising: a first ferromagnetic layer configured to change the magnetization direction; a second ferromagnetic layer; a non-magnetic layer which is located between the first ferromagnetic layer and the second ferromagnetic layer; and a spin-orbit-torque wiring which has the first ferromagnetic layer laminated thereon, wherein the spin-orbit-torque wiring extends in a second direction intersecting a first direction corresponding to an orthogonal direction of the first ferromagnetic layer, wherein the first ferromagnetic layer includes a first laminated structure and an interface magnetic layer in order from the spin-orbit-torque wiring, the interface magnetic layer being configured for the magnetization to be changed, wherein the first laminated structure is a structure in which a ferromagnetic conductor layer and an inorganic compound containing layer are disposed in order from the spin-orbit-torque wiring, wherein the ferromagnetic conductor layer contains a ferromagnetic metal element, wherein the inorganic compound containing layer contains at least one inorganic compound selected from a group consisting of carbide, nitride, and sulfide wherein cationic components in the inorganic compound of the inorganic compound containing layer are light metal elements selected from the group consisting of Mg, Al, Si, Ti, V, Cr, Mn, Cu, Zn, Ga, and Ge, wherein one or more second laminated structures in which a ferromagnetic conductor layer and an inorganic compound containing layer are laminated are inserted between the first laminated structure and the interface magnetic layer, and wherein a film thickness of the ferromagnetic conductor layer of the first laminated structure is thicker than a film thickness of the ferromagnetic conductor layer of the one or more second laminated structures.

2. The spin-orbit-torque type magnetoresistance effect element according to claim 1,
wherein one or more second laminated structure in which a ferromagnetic conductor layer and an inorganic compound containing layer are laminated are inserted between the first laminated structure and the interface magnetic layer.

3. The spin-orbit-torque type magnetoresistance effect element according to claim 1,
wherein a film thickness of the inorganic compound containing layer is 1.0 nm or less.

4. The spin-orbit-torque type magnetoresistance effect element according to claim 1,
wherein the first ferromagnetic layer includes a diffusion preventing layer and the diffusion preventing layer is located on a surface opposite to a contact side to the nonmagnetic layer in the interface magnetic layer.

5. The spin-orbit-torque type magnetoresistance effect element according to claim 1,
wherein the interface magnetic layer contains at least one element selected from a group consisting of Co, Fe, and B.

6. A magnetic memory comprising:
a plurality of the spin-orbit-torque type magnetoresistance effect element according to claim 1.

7. A spin-orbit-torque type magnetoresistance effect element comprising: a first ferromagnetic layer configured to change the magnetization direction; a second ferromagnetic layer; a non-magnetic layer which is located between the first ferromagnetic layer and the second ferromagnetic layer; and a spin-orbit-torque wiring which has the first ferromagnetic layer laminated thereon, wherein the spin-orbit-torque wiring extends in a second direction intersecting a first direction corresponding to an orthogonal direction of the first ferromagnetic layer, wherein the first ferromagnetic layer includes a first laminated structure and an interface magnetic layer in order from the spin-orbit-torque wiring, the interface magnetic layer being configured for the magnetization to be changed, wherein the first laminated structure is a structure in which a ferromagnetic conductor layer and an inorganic compound containing layer are disposed in order from the spin-orbit-torque wiring, wherein the ferromagnetic conductor layer contains a ferromagnetic metal element, wherein the inorganic compound containing layer contains at least one inorganic compound selected from a group consisting of carbide, nitride, and sulfide, wherein cationic components in the inorganic compound of the inorganic compound containing layer are heavy metal elements selected from the group consisting of Mo, Ru, Rh, Pd, Ag, Cd, Hf, Ta, W, Re, Os, Ir, Pt, and Au, wherein one or more second laminated structures in which a ferromagnetic conductor layer and an inorganic compound containing layer are laminated are inserted between the first laminated structure and the interface magnetic layer, and wherein a film thickness of the ferromagnetic conductor layer of the first laminated structure is thicker than a film thickness of the ferromagnetic conductor layer of the one or more second laminated structures.

8. The spin-orbit-torque type magnetoresistance effect element according to claim 7,
wherein one or more second laminated structure in which a ferromagnetic conductor layer and an inorganic compound containing layer are laminated are inserted between the first laminated structure and the interface magnetic layer.

9. The spin-orbit-torque type magnetoresistance effect element according to claim 7,
wherein a film thickness of the inorganic compound containing layer is 1.0 nm or less.

10. The spin-orbit-torque type magnetoresistance effect element according to claim 7,
wherein the first ferromagnetic layer includes a diffusion preventing layer and the diffusion preventing layer is located on a surface opposite to a contact side to the nonmagnetic layer in the interface magnetic layer.

11. The spin-orbit-torque type magnetoresistance effect element according to claim 7,
wherein the interface magnetic layer contains at least one element selected from a group consisting of Co, Fe, and B.

12. A magnetic memory comprising:
a plurality of the spin-orbit-torque type magnetoresistance effect element according to claim 7.

13. A spin-orbit-torque type magnetoresistance effect element comprising: a first ferromagnetic layer configured to change the magnetization direction; a second ferromagnetic layer; a non-magnetic layer which is located between the first ferromagnetic layer and the second ferromagnetic layer; and a spin-orbit-torque wiring which has the first ferromagnetic layer laminated thereon, wherein the spin-orbit-torque wiring extends in a second direction intersecting a first direction corresponding to an orthogonal direction of the first ferromagnetic layer, wherein the first ferromagnetic layer includes a first laminated structure and an interface magnetic layer in order from the spin-orbit-torque wiring, the interface magnetic layer being configured for the magnetization to be changed, wherein the first laminated structure is a structure in which a ferromagnetic conductor layer and an inorganic compound containing layer are disposed in order from the spin-orbit-torque wiring, wherein the ferromagnetic conductor layer contains a ferromagnetic metal element, wherein the inorganic compound containing layer contains at least one inorganic compound selected from a group consisting of carbide, nitride, and sulfide, wherein one or more second laminated structures in which a ferromagnetic conductor layer and an inorganic compound containing layer are laminated are inserted between the first laminated structure and the interface magnetic layer, and wherein a film thickness of the ferromagnetic conductor layer of the first laminated structure is thicker than a film thickness of the ferromagnetic conductor layer of the one or more second laminated structures.

14. The spin-orbit-torque type magnetoresistance effect element according to claim 13,
wherein cationic components in the inorganic compound of the inorganic compound containing layer are light metal elements selected from the group consisting of Mg, Al, Si, Ti, V, Cr, Mn, Cu, Zn, Ga, and Ge.

15. The spin-orbit-torque type magnetoresistance effect element according to claim 13,
wherein cationic components in the inorganic compound of the inorganic compound containing layer are heavy metal elements selected from the group consisting of Mo, Ru, Rh, Pd, Ag, Cd, Hf, Ta, W, Re, Os, Ir, Pt, and Au.

16. The spin-orbit-torque type magnetoresistance effect element according to claim 13,
wherein a film thickness of the inorganic compound containing layer is 1.0 nm or less.

17. The spin-orbit-torque type magnetoresistance effect element according to claim 13,
wherein the first ferromagnetic layer includes a diffusion preventing layer and the diffusion preventing layer is located on a surface opposite to a contact side to the nonmagnetic layer in the interface magnetic layer.

18. The spin-orbit-torque type magnetoresistance effect element according to claim 13,
wherein the interface magnetic layer contains at least one element selected from a group consisting of Co, Fe, and B.

19. A magnetic memory comprising:
a plurality of the spin-orbit-torque type magnetoresistance effect element according to claim 13.

* * * * *